USOO5631842A

United States Patent [19]

Habra et al.

[11] Patent Number: 5,631,842
[45] Date of Patent: May 20, 1997

[54] PARALLEL APPROACH TO CHIP WIRING

[75] Inventors: Rafik R. Habra, Wappingers Falls; Erich C. Schanzenbach, Dover Plains, both of N.Y.

[73] Assignee: International Business Machines Corporation, Armonk, N.Y.

[21] Appl. No.: 400,408

[22] Filed: Mar. 7, 1995

[51] Int. Cl.[6] .................................................. G06F 17/50
[52] U.S. Cl. ..................... 364/490; 364/488; 364/489; 364/491
[58] Field of Search ..................... 364/488, 489, 364/490, 491; 357/68, 45; 235/151.1

[56] References Cited

U.S. PATENT DOCUMENTS

| 3,567,914 | 3/1971 | Neese et al. | 235/151.1 |
|---|---|---|---|
| 4,377,849 | 3/1983 | Finger et al. | 364/491 |
| 4,593,362 | 6/1986 | Bergeron et al. | 364/488 |
| 4,593,363 | 6/1986 | Burstein et al. | 364/491 |
| 4,731,643 | 3/1988 | Dunham et al. | 357/68 |
| 4,742,383 | 5/1988 | Fitzgerald | 357/45 |
| 4,746,966 | 5/1988 | Fitzgerald et al. | 357/68 |
| 4,783,749 | 11/1988 | Duzy et al. | 364/491 |
| 4,849,904 | 7/1989 | Aipperspach et al. | 364/489 |
| 4,918,614 | 4/1990 | Modarres et al. | 364/490 |
| 5,187,671 | 2/1993 | Cobb | 364/490 |
| 5,260,881 | 11/1993 | Agrawal et al. | 364/489 |
| 5,281,558 | 1/1994 | Bamji et al. | 437/250 |
| 5,295,081 | 3/1994 | Habra | 364/489 |
| 5,311,443 | 5/1994 | Crain et al. | 364/491 |
| 5,329,460 | 7/1994 | Agrawal et al. | 364/489 |

OTHER PUBLICATIONS

"Electrical Design Techniques for Highj–Speed Circuit Boards", by N. Matsui and T. Mikazuki, Electronic Manufacturing, 1990 8th IEEE/CHMT Int'l Symposium, Feb. 1990, pp. 234–243.

"Coprocessor Design for Multilayer Surface–Mounted PCB Routing", by R. Venkateswaran and P. Mazumder, IEEE Transactions on Very Large Scale Integration (VLSI) Systems, vol. 1, No. 1, Mar. 1993, pp. 31–45.

"A Parallel Processing Approach for Logic Module Placement" by K. Ueda, et al., IEEE Transactions on Computer Aided Design, vol. CAD–2, No. 1, Jan. 1983, pp. 39 –47.

"A Placement Algorithm for Array Processors", by D–J. Chyan, Xerox, A2–22, 701 S. Aviation Blvd., El. Segundo, CA 90245 & Melvin A. Breuer, Elect. Eng. Dept. Univ. of Southern California, Univ. Park, L.A. CA 90089–0781, 20th Design Automation Conference, 1983 IEEE, pp. 182–188.

"Placement by Simulated Annealing on a Multiprocessor", by Saul A. Kravitz, Student Member, IEEE, and Rob A Rutenbar, Member IEEE, 8200 I.E.E.E. Transactions on Computer–Aided Design CAD–6 (1987) Jul., No. 4, New York, N.Y. USA, pp. 534 –549.

Primary Examiner—Kevin J. Teska
Assistant Examiner—Russell W. Frejd
Attorney, Agent, or Firm—Alison D. Mortinger; Graham S. Jones, II

[57] ABSTRACT

In any of the post-global physical design phases an integrated circuit chip is wired in parallel. The chip is first divided into adjacent bays with rough wiring coordinates from the global wiring phase. Next the bays are grouped into bay groups, with each bay group containing a contiguous group of non-edge bays as well as edge bays which are adjacent another bay group. Each bay group is assigned to a wiring task on a processor, so that the wiring of the bay groups is performed in parallel, using the rough coordinates from the global wiring phase. The wiring tasks are coordinated regarding edge bays in order to achieve wiring consistency between bay groups.

26 Claims, 4 Drawing Sheets

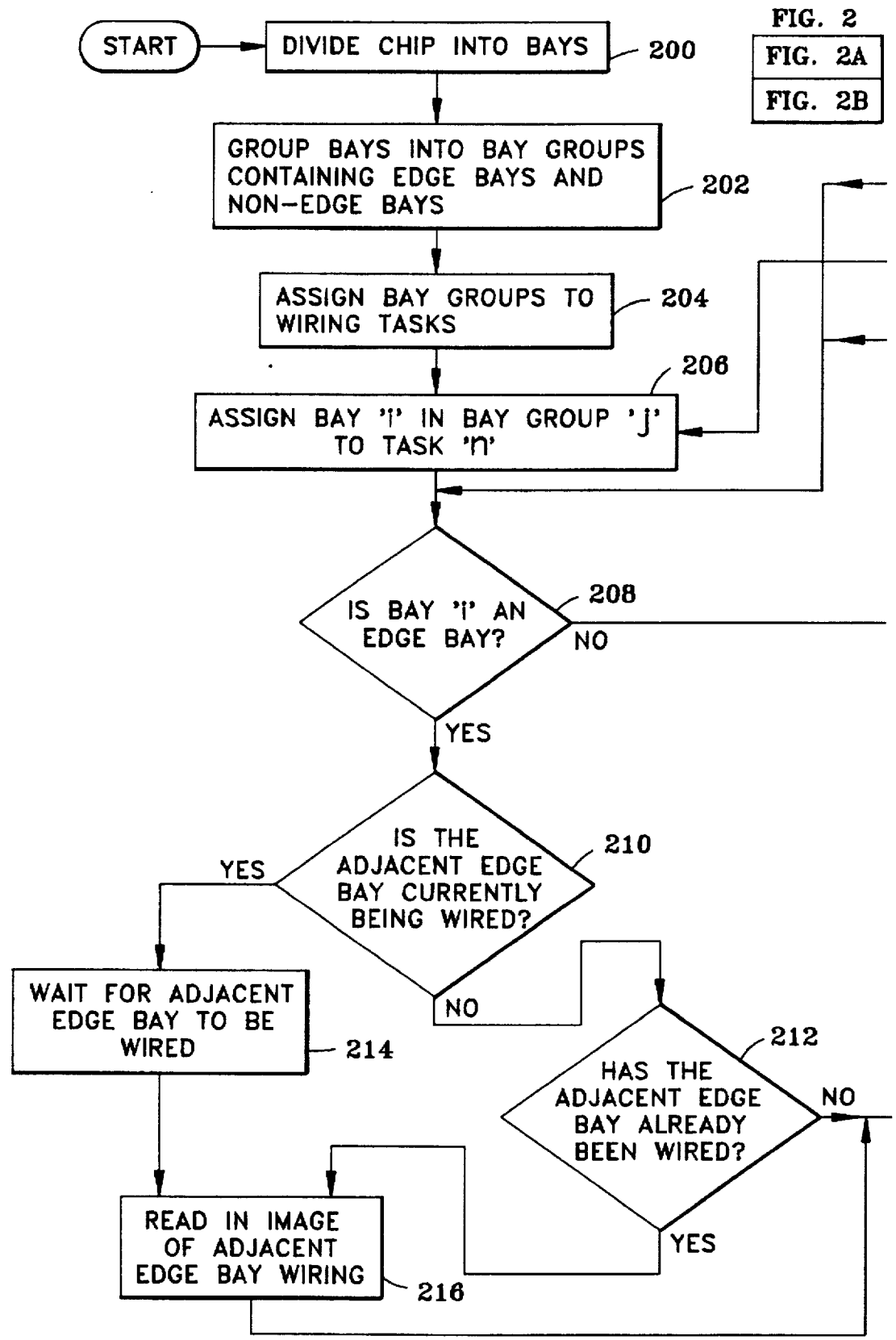

PARALLEL APPROACH TO CHIP WIRING

FIELD

This invention is directed to the wiring of integrated circuits on a substrate. More particularly, it is directed to wiring of circuits in parallel with the wiring of other circuits on the same substrate.

GLOSSARY OF TERMS

The following terms have the following meanings in this specification:

Slice—A rectangular portion of a chip spanning either the entire length or the entire width. The area of the slice is determined by the amount of computer memory available to implement wiring. If the chip is small and the memory sufficient, the slice could encompass the entire area of the chip.

Bay—A subdivision of a slice. It is also rectangular and spans either the entire length or entire width of the chip.

Bay Group—A continguous group of adjacent bays. Synonymous with slice for large chips.

Edge Bay—A bay which is at the boundary of a slice and adjacent to another edge bay in another slice.

Task—A computer-automated job controlled by a processor entailing the wiring of an area of the chip. The area of the chip can be for example a bay, a group of bays, or a slice.

BACKGROUND

Integrated circuit chip wiring is divided into roughly four physical design phases: global wiring, detailed wiring, rip/reroute and finally interactive wiring. Global routing divides the chip into a rectangular global cell grid, where each column or row of cells is referred to as a bay. The number of bays and size of each bay is defined ahead of time, depending on the overall chip size. The global router looks at the various connections that must cross vertical and horizontal bay boundaries and assigns the routes based on supply and demand at a given crossing. Thus the connections in a given net end up being assigned to various vertical and horizontal bays and this becomes the input to the detailed router.

The Job of the detailed router is to route each bay in succession using the rough coordinates suggested by the global router. The connections inside a bay are well defined. Two passes are performed in the post-global phases: first the vertical bays; then the horizontal bays. Prior to this invention, all of the bays in the post-global phases were wired in a serial fashion and thus the process was relatively slow.

PRIOR ART

Prior art has attempted to provide methods by which the optimal placement of circuits and wires is determined, for example in U.S. Pat. No. 4,918,614 to Modarres et al. entitled "Hierarchical Floorplanner." Placement of components and global wiring has also been addressed in U.S. Pat. No. 4,593,363 to Burstein, et al. entitled "Simultaneous Placement and Wiring for VLSI Chips," and in U.S. Pat. No. 5,187,671 to Cobb, et al. entitled "Automated Interconnect Routing System." Others have addressed the editing of wire placement in later circuit designs, for example in U.S. Pat. No. 5,295,081 to Habra, entitled "Concurrent Interactive Wire Editing." None of the prior art has addressed the need for faster wiring in a phase other than global wiring, and none have attempted to wire different areas of a chip at the same time in parallel.

SUMMARY OF THE INVENTION

The invention provides a faster way of completing the post-global wiring physical design phases for wiring an integrated circuit chip than traditional serial methods, while maintaining the wiring quality of the entire chip. This improvement is accomplished by wiring areas of the chip in parallel. The chip is first divided into adjacent bays with rough wiring coordinates from the global wiring phase. Next the bays are grouped into bay groups, with each bay group containing a contiguous group of non-edge bays as well as edge bays which are adjacent another bay group. Each bay group is assigned to a wiring task on a processor, so that the wiring of the bay groups is performed in parallel, using the rough coordinates from the global wiring phase. The wiring tasks are coordinated regarding edge bays in order to achieve wiring consistency between bay groups.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

Please note that the described invention applies to any phase of physical design for an integrated circuit chip which follows global wiring even though the preferred embodiment describes detail wiring in particular.

Once the global wiring phase is complete, the chip is divided into bays with each bay being self contained as far as what connections it encompasses. Therefore two bays could be wired independently and in parallel by separate computer processors. Depending on the number of processors available, the wiring could conceivably be apportioned among N processors, each processor assigned a wiring task, and all running in parallel. This type of allotment would result in a considerable reduction in running time. On the IBM RS/6000 workstation where this invention is operational, parallel wiring is approximately four times faster than serial wiring. Even greater time savings could be realized by dividing the wiring tasks among several workstations.

Although each bay is self-contained with regard to its connections, it is not totally independent from all other bays. A given bay overlaps an adjacent bay by a few wiring channels. This overlap is necessitated from a wirability viewpoint, in case one end of a connection sits at a boundary of a bay. Thus if one processor is wiring bay i, another processor cannot at the same time wire bay i+1, since the two bays share a small common wiring area. It then becomes crucial to properly schedule the various wiring tasks, as to which bays they are assigned, but more importantly at what point in time they can commence routing.

Two scheduling approaches were implemented, one for large chips and one for small chips. Large is defined as those chips whose data cannot fit entirely in the memory of a single processor; the amount of data brought in is dependent on the storage available. The portion of the chip that is small enough for its associated wiring data to fit in the given amount of storage associated with the type of processor used is a group of bays called a slice.

For small chips, because they have an amount of data that can fit entirely into the memory of a single processor, the whole chip is considered to be a slice. However, for faster wiring the small chip slice is divided into groups of bays, with each bay group being smaller than a slice. Thus both large and small chips undergo a succession of wiring tasks, each wiring task wiring its bay group in parallel with the other tasks.

Figure 1:
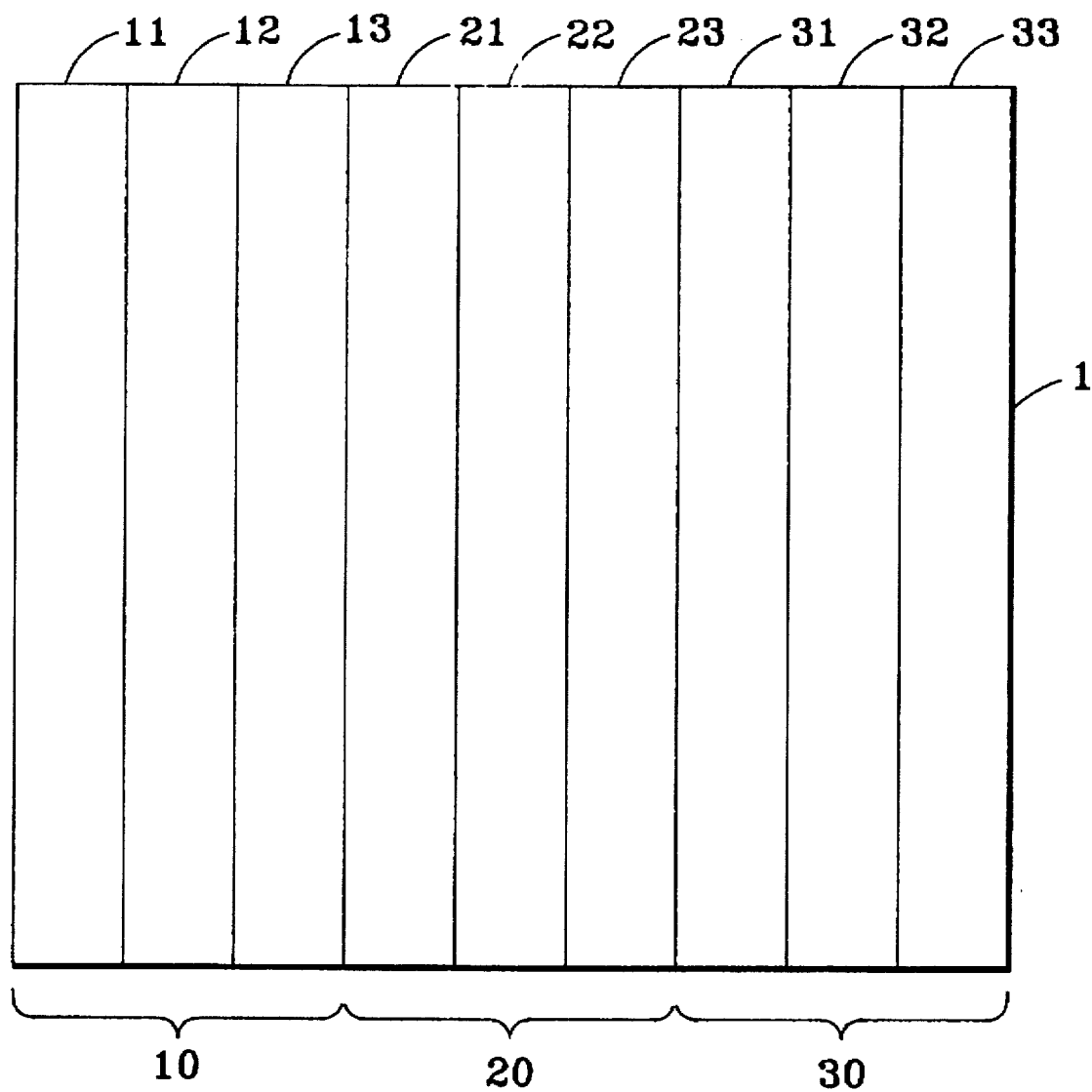
FIG. 1 is a perspective view of a chip divided into vertical slices and bays in accordance with the present invention.

FIG. 1 depicts a much simplified version of a chip divided into vertical slices (or bay groups) and bays for applying the large chip approach. In reality, chips are divided both vertically and horizontally into tens of slices and hundreds of bays.

In FIG. 1, chip 1 has three slices. Each slice has 3 bays, for a total of 9 bays. Slice 10 has bays 11, 12, and 13; slice 20 has bays 21, 22, and 23; and slice 30 has bays 31, 32, and 33. Assume that two processors are available. There will thus be two tasks, one for each processor. Slice 10 is assigned to task 1, and slice 20 to task 2. In a given slice, the bays are wired successively, so for example in slice 10 bay 11 is wired first, then bay 12, and last bay 13. The time it takes to wire each slice is dependent on the degree of difficulty of the wiring and especially on contention from other tasks from other users of the system. Thus different tasks will complete their wiring of the slice they have been assigned at different times.

The communication between the different wiring tasks takes place when the following situation arises. Assume task 1 has finished wiring bay 12 and is ready to start with bay 13. Bay 13 is important because it sits at the boundary of slice 10 and shares space with bay 21 of the next slice. Task 1 first checks if bay 21, assigned to another task, has already been wired. If so, it reads those wires from the chip database and maps them onto its image of slice 10. Only then can it wire bay 13. If on the other hand bay 21 is still unwired, then task 1 can proceed with bay 13. The opposite is true for task 2. Before wiring bay 21, which sits at the edge of a slice, task 2 must determine if bay 13 has already been wired. If it has, those wires must be read and mapped onto the image of slice 20. The images of the slices and bays are kept in a database for the chip which is constantly updated with what bays are being wired at a given time.

When slice 10 is completed by task 1, the routing scheduler assigns the next available slice, which will be slice 30 in this case. Here again, bay 31 cannot start if bay 23 is being wired at that time. Task 1 waits for bay 23 to be completed by task 2, then reads the wires and only then can it start wiring. On the other hand, if task 2 is still at bay 22, then task 1 can safely start bay 31. It then becomes the responsibility of task 2 to wait until bay 31 is completed before starting on bay 23.

With this mechanism in place, the various tasks can safely run in an independent fashion. At the end, the various groups of wires are merged together, but only one task is involved at that stage.

Figure 2B:
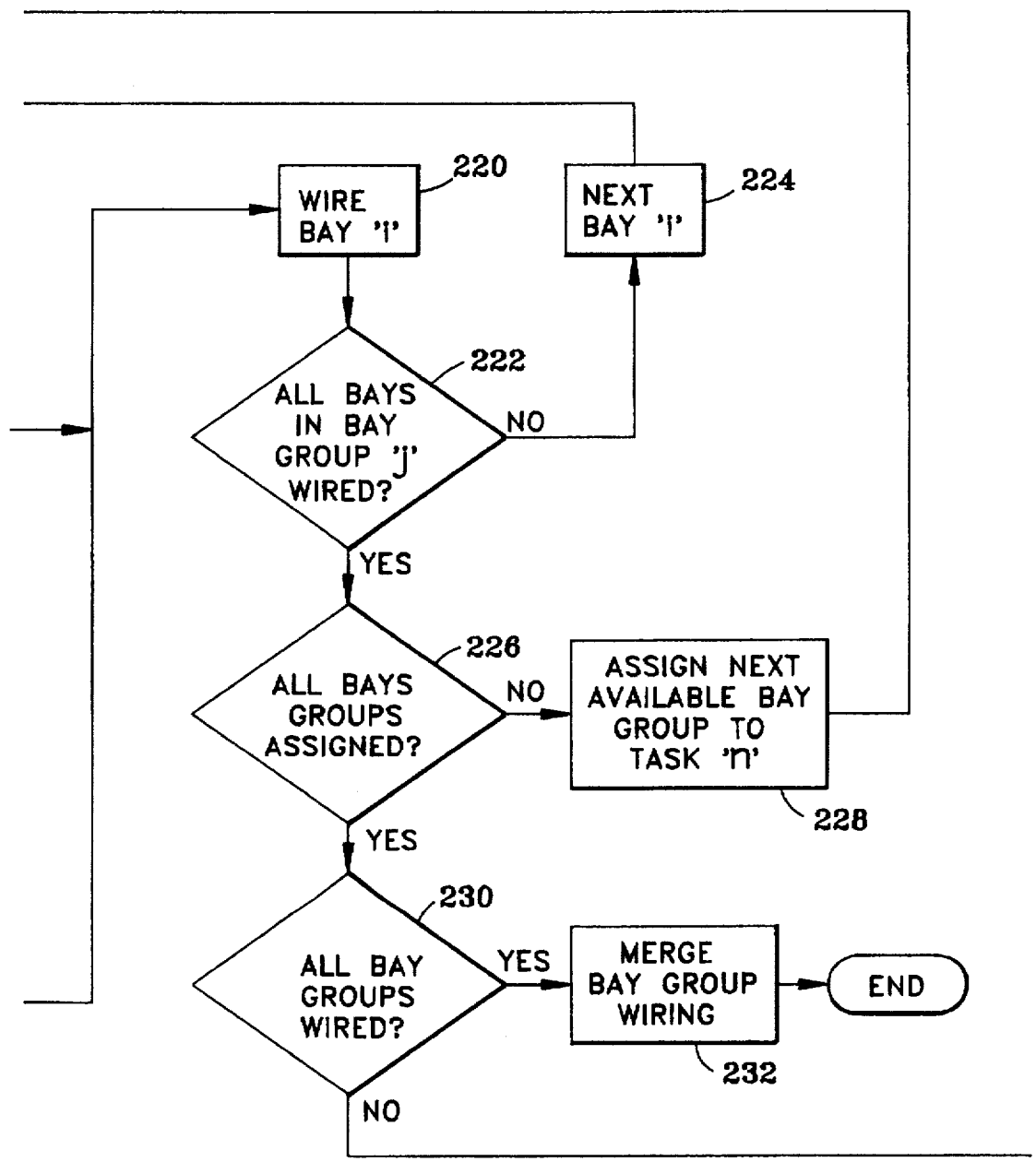
FIG. 2 is a flow chart showing one method of chip wiring in accordance with the present invention.

FIG. 2 illustrates the large or small chip method in flowchart form. In step 200, the chip is divided logically into bays. In 202, the bays are grouped into bay groups, with each bay group having edge bays and non-edge bays. An edge bay is defined as a bay which is at the boundary of a bay group and adjacent to another edge bay in another bay group. For example, bay 23 or bay 31 in FIG. 1 is an edge bay. Note that the bay groups on the edges of the chip will have only one edge bay. Next, in step 204, each wiring task is assigned a bay group. Then in step 206 an individual task n begins with the first bay i in its assigned bay group J. In 208, task n checks whether bay i is an edge bay. If bay i is not an edge bay, wiring can proceed in step 220. Otherwise, bay i is an edge bay and in 210 task n checks to see if the adjacent edge bay in the adjacent bay group is currently being wired. If so, in 214 task n must wait for the adjacent edge bay to be wired. If not, in step 212 task n must also check to see if the adjacent edge bay has already been wired. Once the adjacent edge bay has been wired, from either step 212 or step 214, task n must read the image of the adjacent edge bay wiring from the database. Only then can the bay i be wired in step 220 in accordance with the already wired adjacent edge bay.

After bay i is wired, task n checks to see if all bays in its assigned bay group J have been wired in step 222. If not, task n proceeds to the next bay in step 224 and loops back to step 208. If all bays in bay group j have been wired, then a check is performed to see if all bay groups have been assigned in step 226. If not, then task n is assigned the next available bay group j in 228, and loops back to step 206. Otherwise, all bay groups are assigned and all that remains is to wait for the bay groups to be wired in step 230 and the bay group wiring to be merged to complete the chip wiring for the horizontal or vertical pass in step 232.

Figure 3:
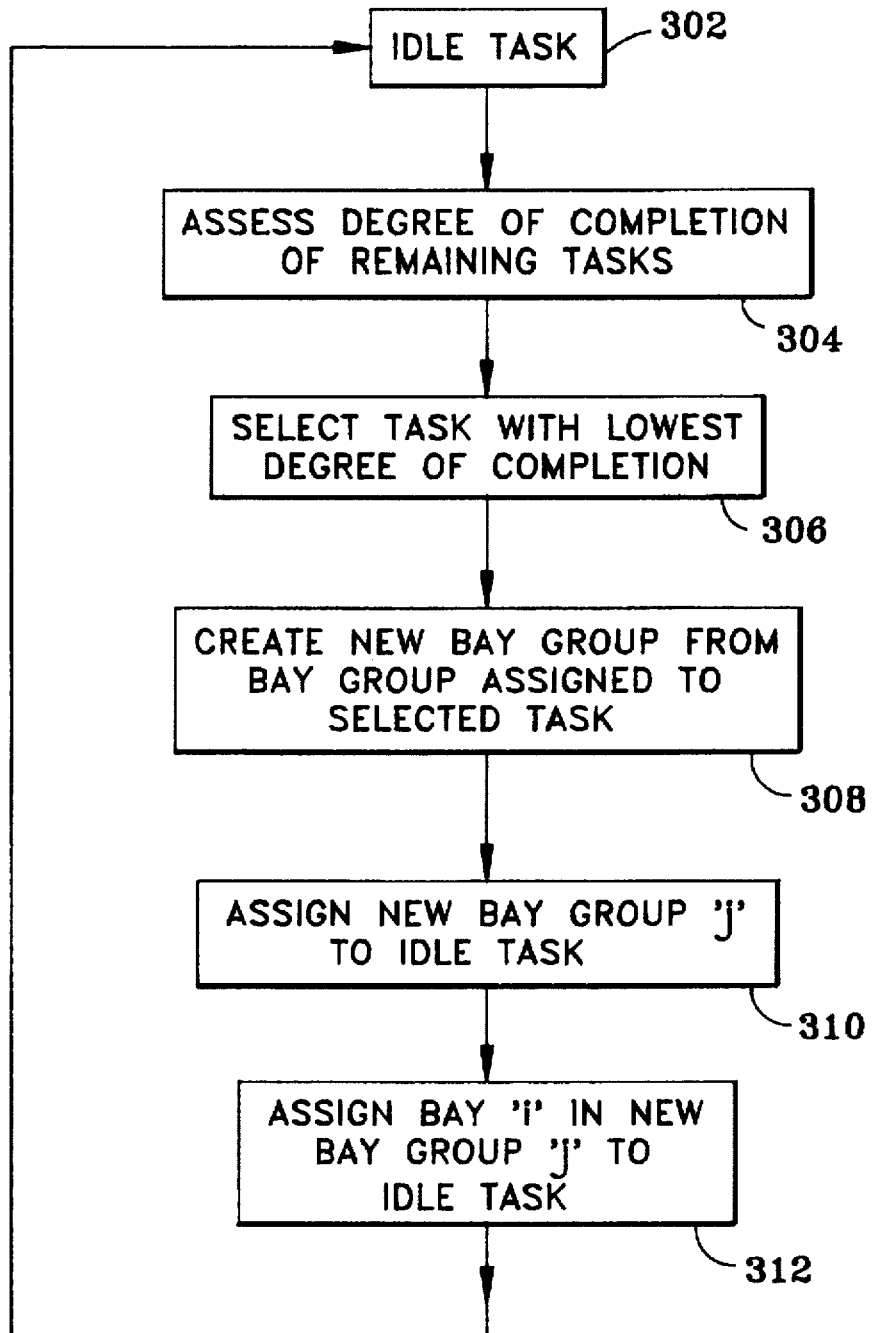
FIG. 3 is a flow chart showing additional steps in the chip wiring method in accordance with the present invention.

Based on the difficulty of wiring each bay group and workload contention for the processors, some tasks will finish their assigned bay group ahead of the other tasks. When all bay groups have been assigned to tasks in step 226, a task will become idle. A way to utilize idle tasks is illustrated in FIG. 3. When a task becomes idle in step 302, then the workload of the remaining tasks still running is assessed in terms of degree of completion in step 304. The task with the least degree of completion, or with most bays left to wire within its bay group, is selected in step 306. A new bay group is created in step 308 from the bay group assigned to the selected task, beginning a few bays ahead of where the selected task is currently wiring. In step 310, the new bay group is assigned to the idle task, and in step 312 bay i in the new bay group is assigned to the idle task. The process then loops back to step 208 for the wiring rules. Note that new edge bays have been created and the wiring tasks are adjusted accordingly. In this manner, once the bay groups are all allocated, as the tasks finish their assigned bay groups the remaining bay groups are subdivided and wired cooperatively by two or more tasks.

Various debugging procedures have been put in place to allow for monitoring and adjustment of the wiring progress. These debugging procedures involve alphanumeric and graphic browsers. A graphic editing tool is also available to assist a developer if the developer chooses to have manual input into the wiring process. For example, one task can be stopped to force contention in order to debug the code associated with scheduling an edge bay. In addition, journaling is available to record the wiring process for assistance in debugging any problems. Error recovery procedures also provide for task reassignment in case one or more tasks fail to complete their assigned slices.

The subject invention has application in the physical design of integrated circuit chips of various types and sizes. It finds particular benefit in the speedy wiring of large and very large scale integrated circuits. Once the global design is completed, the chip is divided into sections called bays with rough wiring coordinates. The bays are then grouped and wired in parallel by different processors. Certain ordering rules are followed so that adjacent bays are properly wired in accordance with the overall wiring of the chip.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for wiring areas on an integrated circuit chip in parallel, comprising the steps of:
   (a) dividing said chip into a plurality of rectangular bays with rough wiring coordinates;
   (b) grouping said rectangular bays into a plurality of bay groups, each bay group containing a contiguous group of bays including non-edge bays and at least one edge bay adjacent another bay group;
   (c) assigning a different bay group to each wiring task of a plurality of wiring tasks; and
   (d) each of said wiring tasks including performing of wiring of said bays in a bay group assigned thereto according to said rough coordinates and performing said wiring in parallel with said other wiring tasks,
      (1) if wiring an edge bay, before wiring begins checking whether the adjacent edge bay has been wired, is currently being wired, or has not been wired, and
         (i) if said adjacent edge bay has been wired, wiring said edge bay in accordance with said adjacent edge bay wiring, or
         (ii) if said adjacent edge bay is currently being wired, waiting for said adjacent edge bay to finish being wired and then wiring said edge bay in accordance with said adjacent edge bay wiring, or
         (iii) if said adjacent edge bay has not been wired, wiring said edge bay, otherwise wiring said non-edge bay.

2. The method of claim 1 wherein each wiring task is controlled by a respective computer processor.

3. The method of claim 2 wherein the wiring of said edge bay in accordance with said adjacent edge bay is performed by accessing a database of detailed wiring data for said plurality of bays.

4. The method of claim 1 further comprising the steps of:
   (e) assigning a next available unwired bay group to a task that has completed wiring its assigned bay group; and
   (f) repeating steps (d) and (e) until all unwired bay groups have been assigned to wiring tasks.

5. The method of claim 4 further comprising the step of merging said wiring of said bay groups to complete said chip wiring.

6. The method of claim 4 after step (f) when a task completes wiring its assigned bay group and becomes idle, further comprising the steps of:
   (g) assessing the degree of completion of each of the remaining wiring tasks in wiring its assigned bay group;
   (h) selecting the wiring task that has the lowest degree of completion;
   (i) creating a new bay group by subdividing said bay group assigned to said selected wiring task;
   (j) assigning said new bay group to the idle task;
   (k) repeating step (d); and
   (l) repeating steps (g) through (k) until all bay groups have been wired.

7. The method of claim 6 further comprising the step of merging said wiring of said bay groups to complete said chip wiring.

8. The method of claim 1 wherein each of said bays covers a generally rectangular area of said integrated circuit chip,
   said bays comprise an array of parallel rectangular areas spanning an entire dimension selected from the length and width of the integrated circuit chip, and
   said bay groups comprise larger parallel rectangular areas spanning an entire dimension selected from the length and width of the integrated circuit chip.

9. The method of claim 1 wherein said bays include relatively horizontal bays and relatively vertical bays.

10. The method of claim 9 wherein all steps are performed twice, once for said relatively horizontal bays, and once for said relatively vertical bays.

11. A method for performing a plurality of wiring tasks for wiring areas on an integrated circuit chip in a parallel process of wiring, comprising the steps of:
    (a) dividing said chip into a plurality of parallel slices spanning an entire dimension of a length or width of a chip, and dividing each said slice into parallel rectangular bays spanning an entire dimension of a length or width of a chip, said bays including rough wiring coordinates,
    (b) grouping said rectangular bays into a plurality of bay groups, each of said bay groups containing a contiguous group of bays including a non-edge bay and at least one edge bay adjacent another bay group,
    (c) assigning each successive bay group to be wired in a different one of said wiring tasks, and
    (d) each of said wiring tasks including performing of wiring of said bays in a bay group assigned thereto according to said rough wiring coordinates and performing said wiring in parallel with performance of said other wiring tasks,
       (1) if wiring an edge bay, before wiring begins checking edge bays status as to whether said adjacent edge bay has been wired, whether said adjacent edge bay is currently being wired, and whether said adjacent edge bay is as yet unwired, and
          (i) if said adjacent edge bay has been wired, wiring said edge bay in accordance with said adjacent edge bay wiring, or
          (ii) if said adjacent edge bay is currently being wired, waiting for said adjacent edge bay to finish being wired and then wiring said edge bay in accordance with said adjacent edge bay wiring, or
          (iii) if said adjacent edge bay is as yet unwired, wiring said edge bay, and otherwise,
       (2) wiring said non-edge bay.

12. The method of claim 11 wherein each wiring task controlled by a respective computer processor.

13. The method of claim 12 wherein said wiring of said edge bay in accordance with said adjacent edge bay is performed by accessing a database of detailed wiring data for said plurality of bays.

14. The method of claim 11 further comprising the steps of:
    (e) assigning a next available unwired bay group to a task that has completed wiring its assigned bay group, and
    (f) repeating steps (d) and (e) until all unwired bay groups have been assigned to wiring tasks.

15. The method of claim 14 further comprising the step of merging said wiring of said bay groups to complete said chip wiring.

16. The method of claim 14 further comprising:
   (g) after step (f) upon completion of wiring of bay groups assigned to a task thereby rendering said task idle, performing the further steps comprising:
      (1) assessing the degree of completion of each of said remaining wiring tasks in wiring its assigned bay group,
      (2) selecting a low completion wiring task that has the lowest degree of completion,
      (3) creating a new bay group by subdividing said bay group assigned to said low completion wiring task,
      (4) assigning said new bay group to said idle task,
      (5) repeating step (4), and
      (6) repeating steps (g) (1) through (g) (5) until all bay groups have been wired.

17. The method of claim 16 further comprising the step of merging the wiring of the bay groups to complete the chip wiring.

18. The method of claim 11 wherein
   said bays comprise an array of parallel rectangular areas spanning an entire dimension selected from the length and width of the integrated circuit chip, and
   said bay groups comprise larger parallel rectangular areas spanning an entire dimension selected from the length and width of the integrated circuit chip.

19. The method of claim 11 wherein the bays are selected from the group consisting of relatively horizontal bays and relatively vertical bays.

20. The method of claim 19 wherein all steps are performed twice, once for the relatively horizontal bays, and once for the relatively vertical bays.

21. A method for performing a plurality of wiring tasks for wiring areas on an integrated circuit chip in a parallel process of wiring, comprising the steps of:
   (a) dividing said chip into a plurality of parallel slices spanning an entire dimension of a length or width of a chip, and dividing each of said slices into parallel rectangular bays spanning an entire dimension of a length or width of a chip, said bays including rough wiring coordinates,
   (b) grouping said rectangular bays into a plurality of bay groups, each said bay group containing a contiguous group of bays including a non-edge bay and at least one edge bay adjacent another bay group,
   (c) assigning each successive bay group to be wired in a different one of said wiring tasks, and
   (d) each of said wiring tasks including performing of wiring of said bays in a bay group assigned thereto according to said rough wiring coordinates and performing said wiring in parallel with performance of said other wiring tasks,
      (1) if wiring an edge bay, before wiring begins checking edge bays status as to whether said adjacent edge bay has been wired, whether said adjacent edge bay is currently being wired, and whether said adjacent edge bay is as yet unwired, and
         (i) if said adjacent edge bay has been wired, wiring said edge bay in accordance with said adjacent edge bay wiring, or
         (ii) if said adjacent edge bay is currently being wired, waiting for said adjacent edge bay to finish being wired and then wiring said edge bay in accordance with said adjacent edge bay wiring, or
         (iii) if said adjacent edge bay is as yet unwired, wiring said edge bay, and otherwise,
      (2) wiring said non-edge bay,
   (e) assigning a next available unwired bay group to a task that has completed wiring its assigned bay group, and
   (f) repeating steps (d) and (e) until all unwired bay groups have been assigned to wiring tasks,
   (g) after step (f), upon completion of wiring of bay groups assigned to a task, thereby rendering said task idle, performing the further steps comprising:
      (1) assessing the degree of completion of each of said remaining wiring tasks in wiring its assigned bay group,
      (2) selecting a low completion wiring task that has the lowest degree of completion,
      (3) creating a new bay group by subdividing said bay group assigned to said low completion wiring task,
      (4) assigning said new bay group to said idle task,
      (5) repeating step (d), and
      (6) repeating steps (g) (1) through (g) (5) until all bay groups have been wired.

22. The method of claim 21 further comprising the step of merging said wiring of said bay groups to complete said chip wiring.

23. The method of claim 21 wherein
   said bays comprise an array of parallel rectangular areas spanning an entire dimension selected from the length and width of the integrated circuit chip and
   said bay groups comprise larger parallel rectangular areas spanning an entire dimension selected from the length and width of the integrated circuit chip.

24. The method of claim 21 wherein the bays are selected from the group consisting of relatively horizontal bays and relatively vertical bays.

25. The method of claim 24 wherein all steps are performed twice, once for the relatively horizontal bays, and once for the relatively vertical bays.

26. A method for performing a plurality of wiring tasks for wiring areas on an integrated circuit chip in a parallel process of wiring, comprising the steps of:
   (a) dividing said chip into a plurality of parallel slices spanning an entire dimension of selected from the length and the width of a chip, and dividing each of said slices into parallel rectangular bays, said bays spanning an entire dimension selected from the length and the width of a chip, each of said bays covering a generally rectangular area of the integrated circuit chip, said bays including rough wiring coordinates,
   (b) grouping said rectangular bays into a plurality of bay groups, each said bay group containing a contiguous group of bays including a non-edge bay and at least one edge bay adjacent another bay group,
   (c) assigning each successive bay group to be wired in a different one of said wiring tasks, and
   (d) each of said wiring tasks including performing of wiring of said bays in a bay group assigned thereto according to said rough wiring coordinates and performing said wiring in parallel with performance of said other wiring tasks wherein each of said wiring tasks is controlled by a respective computer processor, and
      (1) if wiring an edge bay, before wiring begins checking edge bays status as to whether said adjacent edge bay has been wired, whether said adjacent edge bay is currently being wired, and whether said adjacent edge bay is as yet unwired, and
         (i) if said adjacent edge bay has been wired, wiring said edge bay in accordance with said adjacent edge bay wiring, or (ii) if said adjacent edge bay is currently being wired, waiting for said adjacent edge bay to finish being wired and then wiring said edge bay in accordance with said adjacent edge bay wiring, or (iii) if said adjacent edge bay is as yet unwired, wiring said edge bay in accordance with said adjacent edge bay by accessing a database of detailed wiring data for said plurality of bays, and otherwise, (2) wiring said non-edge bay, (e) assigning a next available unwired bay group to a task that has completed wiring its assigned bay group, (f) repeating steps (d) and (e) until all unwired bay groups have been assigned to wiring tasks, (g) after step (f) upon completion of wiring of bay groups assigned to a task thereby rendering said task idle, performing the further steps comprising:

(1) assessing the degree of completion of each of said remaining wiring tasks in wiring its assigned bay group, (2) selecting a low completion wiring task that has the lowest degree of completion, (3) creating a new bay group by subdividing said bay group assigned to said low completion wiring task, (4) assigning said new bay group to said idle task, (5) repeating step (d), and (6) repeating steps (g) (1) through (g) (5) until all bay groups have been wired, (h) all steps are performed twice, once for the relatively horizontal bays, and once for the relatively vertical bays, and (i) merging said wiring of said bay groups to complete said chip wiring.

* * * * *

UNITED STATES PATENT AND TRADEMARK OFFICE
CERTIFICATE OF CORRECTION

PATENT NO.   : 5,631,842
DATED        : May 20, 1997
INVENTOR(S)  : Rafik R. Habra, et al It is certified that error appears in the above-indentified patent and that said Letters Patent is hereby corrected as shown below:

Col. 1, line 44, correct "The Job of the detailed..."
                to read --The job of the detailed...--;

Col. 2, line 41, correct "self contained"
                to read --self-contained--;

Col. 4, line 18, correct "bay group J"
                to read --bay group j--;

Signed and Sealed this

Nineteenth Day of August, 1997

Attest:

BRUCE LEHMAN

Attesting Officer

Commissioner of Patents and Trademarks